Aug. 10, 1965 R. D. McKIEL 3,200,360

CONTACT-CAMMING PRINTED CIRCUIT BOARD

Filed June 20, 1962 2 Sheets-Sheet 1

Inventor:
Robert D. McKiel,
by Walter S. Jones
Att'y.

Aug. 10, 1965 R. D. McKIEL 3,200,360

CONTACT-CAMMING PRINTED CIRCUIT BOARD

Filed June 20, 1962 2 Sheets-Sheet 2

Inventor:
Robert D. McKiel,
by Walter S. Jones
Att'y.

3,200,360
Patented Aug. 10, 1965

3,200,360

CONTACT-CAMMING PRINTED CIRCUIT BOARD

Robert D. McKiel, Reading, Mass., assignor to United-Carr Incorporated, a corporation of Delaware Filed June 20, 1962, Ser. No. 203,955
1 Claim. (Cl. 339—17)

This invention relates to so-called printed circuit board connector devices wherein an edge of a board is pressed into engagement with a circuit board receiving socket and contact is made between predetermined circuits on the board and yieldable spring fingers arranged in the socket.

So-called printed circuit boards and connectors are well known in the art but the device illustrated, described and claimed in this application has advantages over anything known in the art because it has provision for camming a spring finger or spring fingers during engagement of the board with the socket in such a manner that the spring finger or spring fingers never contact any of the edges of the circuit or circuits. This, as will be understood by anyone skilled in the art, is important to prevent damage to the printed circuit during engagement and disengagement of the parts.

The novel feature of the device is the provision of some sort of camming means, preferably provided by the circuit board, that prevents a spring finger or spring fingers of the socket contacting with the circuit or circuits except on a smooth surface thereof, and at no time permit the spring finger or spring fingers to engage with a "raw" edge of the circuit material.

Another object of the invention is to provide a circuit board wherein at least one circuit is continuous, located on both sides of the board, and is connected adjacent an edge of the board. It is obvious that such a construction will provide a more compact circuit unit.

Another object of the invention is to provide camming means adjacent the insertable edge of the board that will automatically move the spring finger or spring fingers of the socket so that it or they cannot contact the circuit medium except upon a smooth surface thereof.

In the drawings which illustrate a preferred embodiment of the invention:

Figures 1, 2:
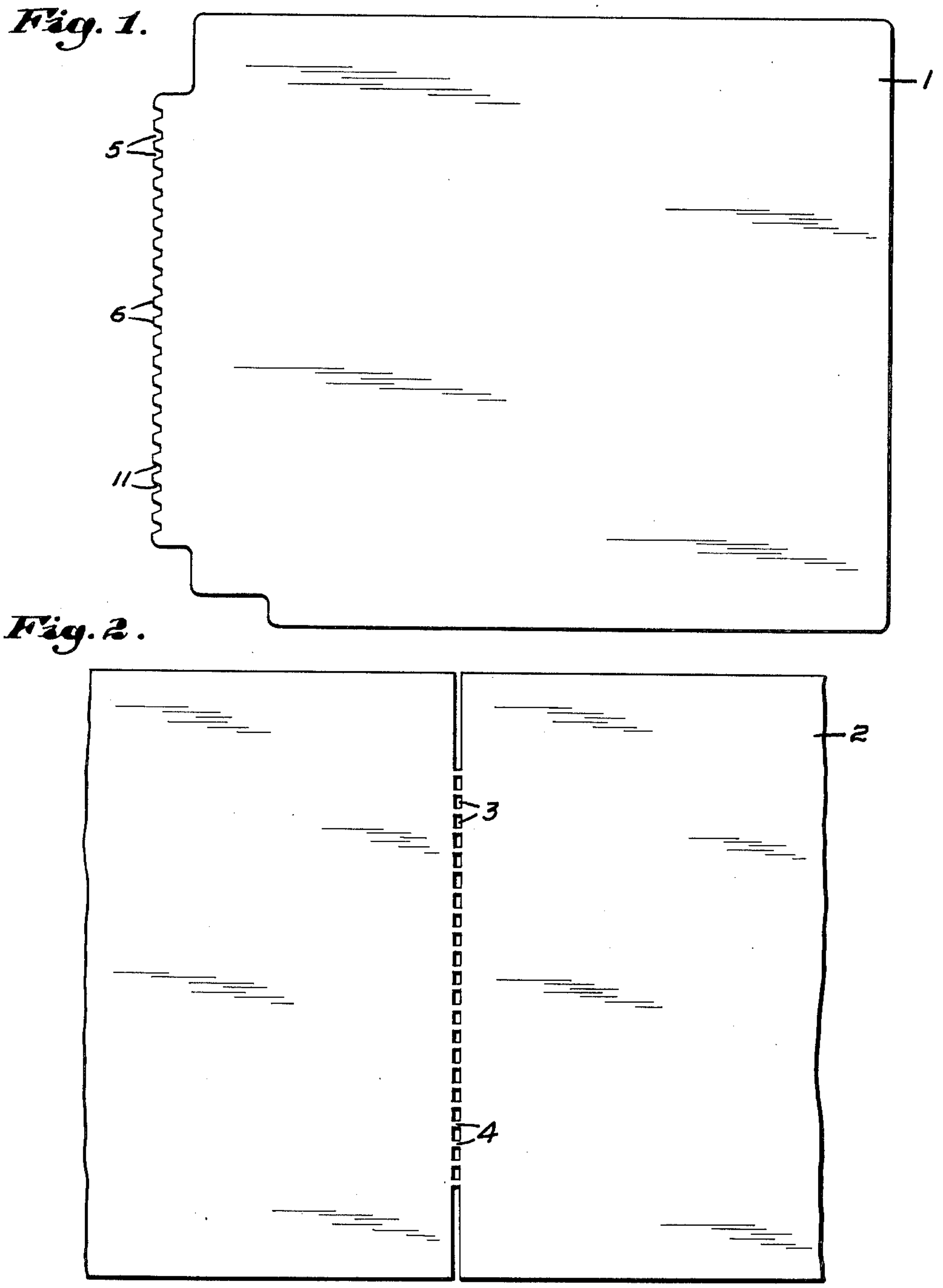
FIG. 1 is a plan view of a printed circuit board with a series of edge notches prior to the printed circuit material being applied.
FIG. 2 is a plan view of a sheet of suitable printed circuit foil material prior to being engaged with the board shown in FIG. 1.
Figure 4:
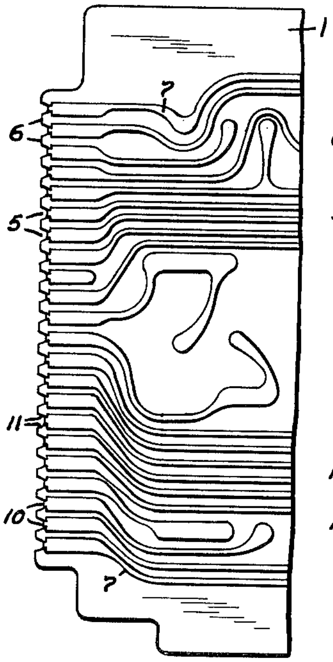
FIG. 4 is a plan view of a portion of the printed circuit board shown in FIG. 3 prior to engagement with a socket and showing one face thereof.

With reference to the particular construction selected for illustration of the invention there is shown, in FIG. 1, a preferred form of flat printed circuit board 1 and, in FIG. 2, a plan view of a sheet of foil material 2 which has been punched out along its center to provide a series of apertures 3 and connecting portions 4 which engage with the notches 5 and projections 6 on an edge of the board 1 when the foil is wrapped over the edge of the board. Thereafter, as will be understood by anyone skilled in the art, the printed conductors 7 (FIG. 4) of suitable shape may be applied to the board and then the excess material 2 removed.

Figure 3:
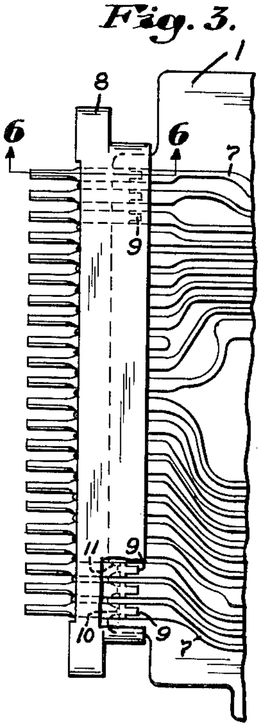
FIG. 3 is a plan view showing a printed circuit socket and a portion of printed circuit board engaged therewith.

Any standard type of socket connector 8 (FIG. 3) having a series of spring fingers 9 (some shown in full lines and some shown in dotted lines in FIG. 3) may be used. However, the device is provided with camming means which will be described hereafter.

Figure 5:
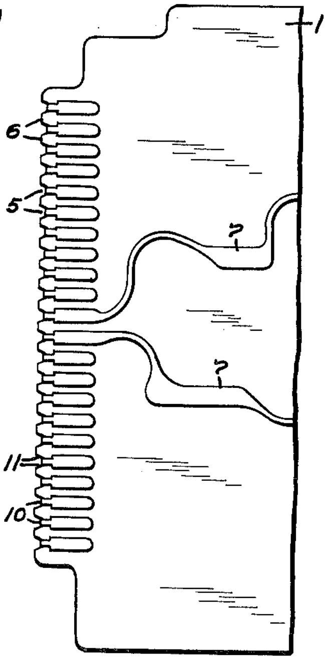
FIG. 5 is a view similar to FIG. 4 showing the other side face thereof.

It should be understood that the printed conductors 7 may be entirely on one side of the board or they may be carried over the edge of the board through the notches 5 and if desirable extend on the opposite side of the board (two of which circuits on the opposite side being shown in FIG. 5). The material of the circuit, such as copper for example, is placed on the board and then a die is engaged to cut the circuit from the material and simultaneously adhere the circuit to the board. The excess is then stripped from the board by methods well known in the art. It should also be understood that while there may be described a flat, thin, printed circuit board the invention will be just as useful in connection with a board that may be tubular or any other suitable shape to co-operate with a similar shaped socket and that the conductor or conductors may be formed and adhered to the board in any suitable manner.

Figure 8:
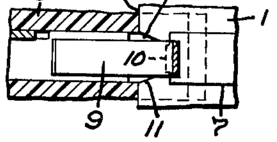
FIG. 8 is a section taken on the line 8—8 of FIG. 6 to show the relative dimensions of the parts.

An important feature of applicant's invention is the provision of camming means whereby, when the printed circuit board is forced into the socket, a spring finger or spring fingers will be forced to yield and make contact with a circuit or circuits 7 without first coming in contact with any edge portion of the circuit material 7. This camming means may be formed in any suitable manner but it is preferred to provide the camming means by forming tapered notches 5 (FIGS. 4 and 8) and having those portions 10 of the circuit material passing through the notches 5 of less width than the width of a spring finger 9 as clearly shown in FIG. 8.

To state the idea in another way, the width of a spring finger is greater than portions of the notches other than the entering portions so that the finger or fingers will engage the tapered side edge 11 of the notches 5 and the side edge of its co-operating projection so that the projections 6 will first contact with the spring fingers 9 and as the board is entered into the socket (FIG. 6) the spring finger or spring fingers will be forced out of the normal plane and out of initial contact with the material of the circuit 7 so that as the engagement continues the flat surface of the spring finger or spring fingers will come in surface-to-surface contact with the flat surface of the circuit 7 whether on one or both sides of the circuit board.

Figures 6, 7, 9:
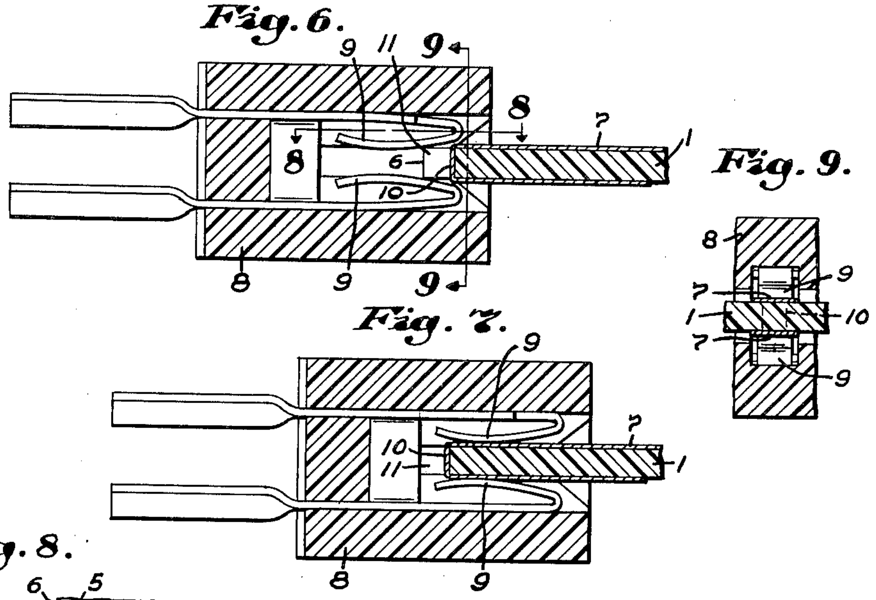
FIG. 6 is an enlarged view taken on line 6—6 of FIG. 3 showing the edge of the printed circuit board in initial contact with the spring finger.
FIG. 7 is a sectional view, similar to FIG. 6 showing the printed circuit board completely engaged with the socket.
FIG. 9 is a section taken on the line 9—9 of FIG. 6.

As shown in FIG. 7, it is believed that anyone skilled in the art will now appreciate, from the drawings and the description above, that a new and useful connector has been provided that will prevent damage to any type of circuit or circuits provided on the so-called board during its engagement with and disengagement from a socket 8.

While there has been illustrated and described a particular, satisfactory, improved construction over anything in the known prior art, it should be understood that the invention is best defined by the following claim:

I claim:

A circuit board connector device comprising in combination, a circuit board-receiving socket and a circuit board having an engagement edge adapted to engage said socket, said engagement edge including a series of projections having terminal ends extending therefrom, each of said projections being spaced from the other to provide a notch, and each of said projections having side walls tapering toward said terminal ends, each of said side walls lying in a plane which is in angular relation with the plane of said circuit board, and circuit conductors formed on said board, some of said conductors extending at least up to said notches, and said socket including electrical connections having spring fingers, said spring fingers having a width greater than the root of said notches and less than the distance between the terminal ends of said projections and said electrical connections indexed to engage said notches, whereby said spring fingers engage said side walls and cammed away from contact with said conductors until said spring fingers are in overlapping relation to said conductors when said board is pressed into engagement with said socket.

References Cited by the Examiner

UNITED STATES PATENTS

| | | | |
|---|---|---|---|
| 2,811,700 | 10/57 | Kuch | 339—17 |
| 2,858,515 | 10/58 | Thunander et al. | 339—17 |
| 2,959,758 | 11/60 | Geshner et al. | 339—17 |
| 2,993,188 | 7/61 | Anderson | 339—17 |
| 3,140,907 | 7/64 | Davies | 339—17 |

DONLEY J. STOCKING, *Primary Examiner.*

M. HENSON WOOD, Jr., JOSEPH D. SEERS, ALFRED S. TRASK, *Examiners.*